(12) United States Patent
Morimoto et al.

(10) Patent No.: US 12,187,536 B2
(45) Date of Patent: Jan. 7, 2025

(54) ARTICLE TRANSPORT FACILITY

(71) Applicant: Daifuku Co., Ltd., Osaka (JP)

(72) Inventors: Yuichi Morimoto, Komaki (JP);
Shinichiro Higashi, Komaki (JP)

(73) Assignee: Daifuku Co., Ltd., Osaka (JP)

( * ) Notice: Subject to any disclaimer, the term of this patent is extended or adjusted under 35 U.S.C. 154(b) by 883 days.

(21) Appl. No.: 17/328,226

(22) Filed: May 24, 2021

(65) Prior Publication Data

US 2021/0362949 A1 Nov. 25, 2021

(30) Foreign Application Priority Data

May 25, 2020 (JP) .................. 2020-090371

(51) Int. Cl.
| | | |
|---|---|---|
| *B65G 1/04* | (2006.01) | |
| *B61B 3/02* | (2006.01) | |
| *B61B 5/02* | (2006.01) | |
| *B65G 35/06* | (2006.01) | |
| *H01L 21/677* | (2006.01) | |

(52) U.S. Cl.
CPC .............. *B65G 1/0492* (2013.01); *B61B 3/02* (2013.01); *B61B 5/02* (2013.01); *B65G 1/0457* (2013.01); *B65G 1/0464* (2013.01); *B65G 35/06* (2013.01); *H01L 21/67715* (2013.01); *H01L 21/67733* (2013.01); *H01L 21/67736* (2013.01); *B65G 2201/0235* (2013.01); *B65G 2201/0297* (2013.01)

(58) Field of Classification Search
CPC ..... B61B 3/02; B61B 5/02; B65G 2201/0297; B65G 2201/0235; B65G 1/0457; B65G 1/0464; B65G 1/0492; B65G 35/06; B65G 35/02; H01L 21/67733; H01L 21/67736; H01L 21/67715
See application file for complete search history.

(56) References Cited

U.S. PATENT DOCUMENTS

| | | | |
|---|---|---|---|
| 9,073,691 B2* | 7/2015 | Morimoto | ............ B65G 1/0457 |
| 9,536,766 B2* | 1/2017 | Kinugawa | ......... H01L 21/67379 |
| 10,083,847 B2* | 9/2018 | Tomida | ............. H01L 21/67259 |
| 10,310,513 B2* | 6/2019 | Maejima | .................. G05D 1/03 |
| 10,479,601 B2* | 11/2019 | Tai | ............................. B07C 5/36 |
| 11,069,549 B2* | 7/2021 | Wada | ................ H01L 21/67724 |
| 2015/0332948 A1* | 11/2015 | Ikeda | ................ H01L 21/67736 700/230 |
| 2016/0340122 A1* | 11/2016 | Lindblom | ............ G06Q 10/087 |
| 2017/0247190 A1* | 8/2017 | Horii | .................... B65G 19/025 |
| 2019/0115234 A1 | 4/2019 | Ogawa et al. | |

FOREIGN PATENT DOCUMENTS

| | | |
|---|---|---|
| JP | 577906 A | 3/1993 |
| KR | 102019001553 A | 1/2019 |
| KR | 1020190041417 A | 4/2019 |
| WO | 2015174181 A1 | 11/2015 |

\* cited by examiner

Primary Examiner — Zachary L Kuhfuss
Assistant Examiner — Cheng Lin
(74) Attorney, Agent, or Firm — The Webb Law Firm

(57) ABSTRACT

A first carriage is provided with a support rail that supports a main body, and is configured to travel together with a second carriage that includes the main body along the first path, in a supporting state that is a state of supporting the main body, using the support rail. In a state where the first carriage is located at a connection part of the first path, which is connected to the second path, the support rail is located on an extension line of the travel rail.

11 Claims, 8 Drawing Sheets

ARTICLE TRANSPORT FACILITY

CROSS-REFERENCE TO RELATED APPLICATION

This application claims priority to Japanese Patent Application No. 2020-090371 filed May 25, 2020, the disclosure of which is hereby incorporated by reference in its entirety.

BACKGROUND OF THE INVENTION

1. Field of the Invention

The present invention relates to an article transport facility that includes a first carriage that travels along a first path that is formed along the ceiling and a second carriage that travels along a second path.

2. Description of Related Art

One example of the above-described article transport facility is disclosed in WO 2015/174,181 (Patent Document 1). Hereinafter, the reference numerals shown in parentheses in the descriptions of the related art and the problems to be solved are those of Patent Document 1. A transport system (2) that serves as the article transport facility disclosed in Patent Document 1 includes a ceiling travel vehicle (4) that travels along a travel track (6) supported from a ceiling (25) side, and a local carriage (16) that travels along a local track (20). A buffer (22) is provided along the local track (20), and the local carriage (16) transports an article (10) between a load port (14) and the buffer (22). The local carriage (16) lifts and lowers a lifting/lowering platform (52) that holds the article (10), by using a hoist (50), to transfer the article (10) to the load port (14) or the buffer (22). Also, the ceiling travel vehicle (4) lifts and lowers a lifting/lowering platform (8) by using a hoist, to transfer the article (10) to the load port (14) or the buffer (22).

SUMMARY OF THE INVENTION

In the above-described article transport facility, it may be necessary to transport an article along both the first path and the second path depending on the location of the transport source and the transport destination of the article. In addition, in order to keep the length of the article transport paths short, it may be desirable to transport the article along both the first path and the second path. For example, in the transport system (2) of Patent Document 1, when the article (10) held by the ceiling travel vehicle (4) is to be unloaded onto the buffer (22) that is placed in a location that is only accessible by the local carriage (16), the article (10) needs to be transported along both the travel track (6) that serves as the first path and the local track (20) that serves as the second path. In this case, in the transport system (2) according to Patent Document 1, in order to pass the article (10) from the ceiling travel vehicle (4) to the local carriage (16), it is necessary to temporarily place the article (10) in the buffer (22) or the like that is accessible to both the ceiling travel vehicle (4) and the local carriage (16), and the time required for transporting the article (10) tends to be long.

Therefore, there is a demand for realizing an article transport facility that is capable of reducing the time required for transporting the article when transporting the article along both the first path and the second path.

An article transport facility according to the present disclosure includes: a first carriage that travels along a first path that is formed along a ceiling; a second carriage that travels along a second path whose one end or both ends are connected to the first path in a plan view; and a travel rail that is provided along the second path, wherein the second carriage includes a main body that travels along the travel rail, a holding unit that holds an article, and a lifting/lowering mechanism that lifts and lowers the holding unit relative to the main body, and is configured to, when transferring the article between a transfer target position that is located below the second path, and the holding unit, lower the holding unit by using the lifting/lowering mechanism to a height corresponding to the transfer target position, the first carriage is provided with a support rail that supports the main body, and is configured to be able to travel along the first path together with the second carriage that includes the main body, in a supporting state that is a state of supporting the main body, using the support rail, and in a state where the first carriage is located at a connection part of the first path, which is connected to the second path, the support rail is located on an extension line of the travel rail.

According to this configuration, the first carriage is configured to move along the first path together with the second carriage, in a supporting state that is the state of supporting the main body of the second carriage, using the support rail. Therefore, by causing the first carriage in the supporting state to travel along the first path, it is possible to transport an article that is held by the holding unit of the second carriage supported by the first carriage, along the first path. Also, with this configuration, by causing the second carriage to travel along the second path, it is possible to transport an article that is held by the holding unit of the second carriage, along the second path.

Also, with this configuration, in a state where the first carriage is located at a connection part of the first path, which is connected to the second path, the support rail that supports the main body of the second carriage is located on the extension line of the travel rail that is provided along the second path and along which the main body of the second carriage travels. Therefore, in this state, it is possible to cause the main body of the second carriage to travel between the support rail and the travel rail. Therefore, by arranging the first carriage at the connection part, it is possible to enable the second carriage to exit from the first carriage and enter the second path while keeping the second carriage in the state of holding an article using the holding unit, and exit from the second path so as to be mounted on the first carriage. Therefore, it is possible to swiftly transport an article between the first path and the second path at the connection part. As a result, when transporting an article along both the first path and the second path, it is possible to reduce the time required to transport the article.

Further features and advantages of the article transport facility will be apparent from the embodiments described below with reference to the drawings.

DETAILED DESCRIPTION OF PREFERRED EMBODIMENTS

The following describes embodiments of an article transport facility with reference to the drawings.

Figure 1:
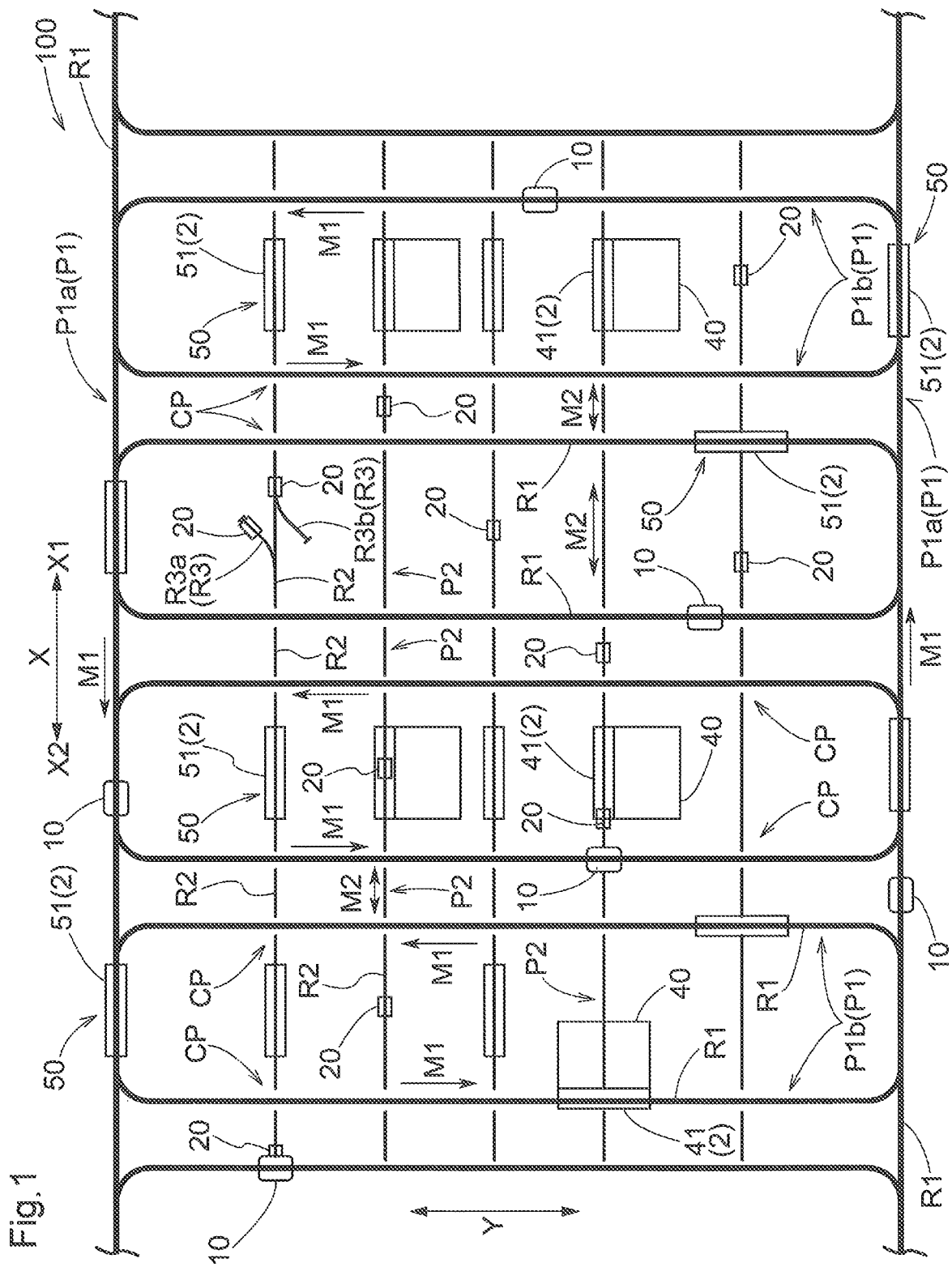
FIG. 1 is a plan view showing a part of an article transport facility.

As shown in FIG. 1, an article transport facility 100 includes a first carriage 10 that travels along a first path P1 and a second carriage 20 that travels along second paths P2. In FIG. 1, the second paths P2 are shown as solid lines that are thinner than the first path P1. One end or both ends of each second path P2 is connected to the first path P1 in a plan view (a view seen in a direction in a top-bottom direction Z). In the present embodiment, a plurality of second paths P2 are formed, and both ends of at least one second path P2 is connected to the first path P1 in a plan view. In the example shown in FIG. 1, both ends of every second path P2 are connected to the first path P1 in a plan view. Note that FIG. 1 shows the ends of each second path P2 at a distance from the first path P1 in order to make it easier to distinguish between the first path P1 and the second paths P2. It is possible to employ a configuration that includes a mix of a second path P2 that is connected to the first path P1 at both ends thereof in a plan view and a second path P2 that is connected to the first path P1 at one end thereof in a plan view, or employ a configuration in which every second path P2 is connected to the first path P1 at one end thereof in a plan view.

When two horizontal directions that are orthogonal to each other are denoted as a first horizontal direction X and a second horizontal direction Y, in the example shown in FIG. 1, the first path P1 includes first portions P1a that are formed so as to extend in the first horizontal direction X in a plan view and second portions P1b that are formed so as to extend in the second horizontal direction Y in a plan view. A plurality of second portions P1b are arranged side by side in the first horizontal direction X, and each of the second portions P1b connects the first portion P1a provided on one side in the second horizontal direction Y and the first portion P1a provided on the other side in the second horizontal direction Y with each other. That is to say, the second portions P1b form a path that branches from one first portion P1a and joins the other first portion P1a.

In the example shown in FIG. 1, the second paths P2 are formed so as to extend in the first horizontal direction X. The second paths P2 connects two second portions P1b that are adjacent to each other in the first horizontal direction X. That is to say, when one direction in the first horizontal direction X is denoted as a first side X1 and the other direction is denoted as a second side X2, the ends of the second paths P2 on the first side X1 are connected to the second portion P1b located on the first side X1 of two second portions P1b that are adjacent to each other in the first horizontal direction X, and the ends of the second paths P2 on the second side X2 are connected to the second portions P1b located on the second side X2 of the two second portions P1b. A plurality of second paths P2 are provided side by side in the second horizontal direction Y between two second portions P1b that are adjacent to each other in the first horizontal direction X. Note that the layout of the first path P1 and the second paths P2 shown in FIG. 1 is an example, and the layout of the first path P1 and the second path P2 may be changed when necessary.

Figure 2:
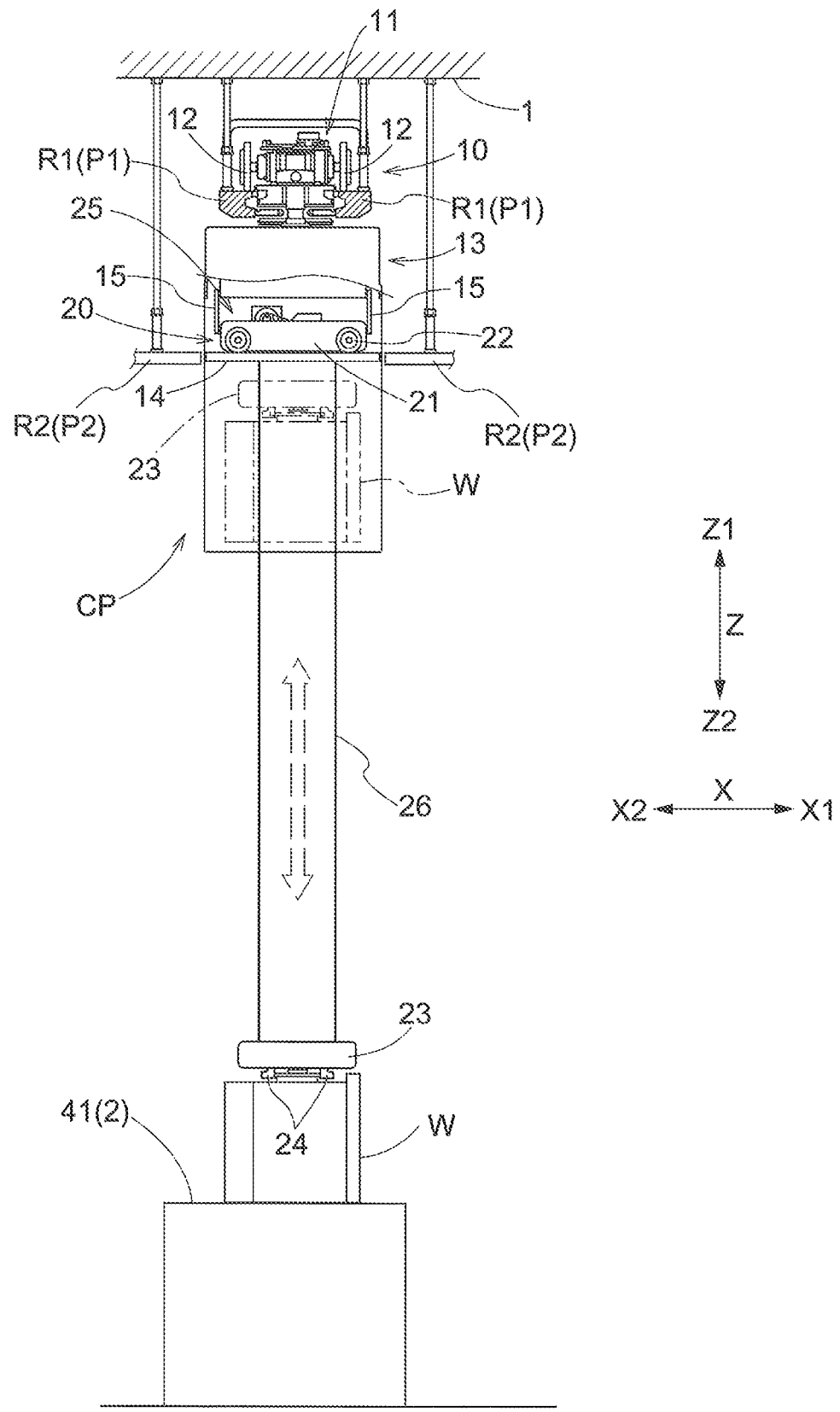
FIG. 2 is a diagram illustrating article transfer processing that is performed at a connection part.
Figure 3:
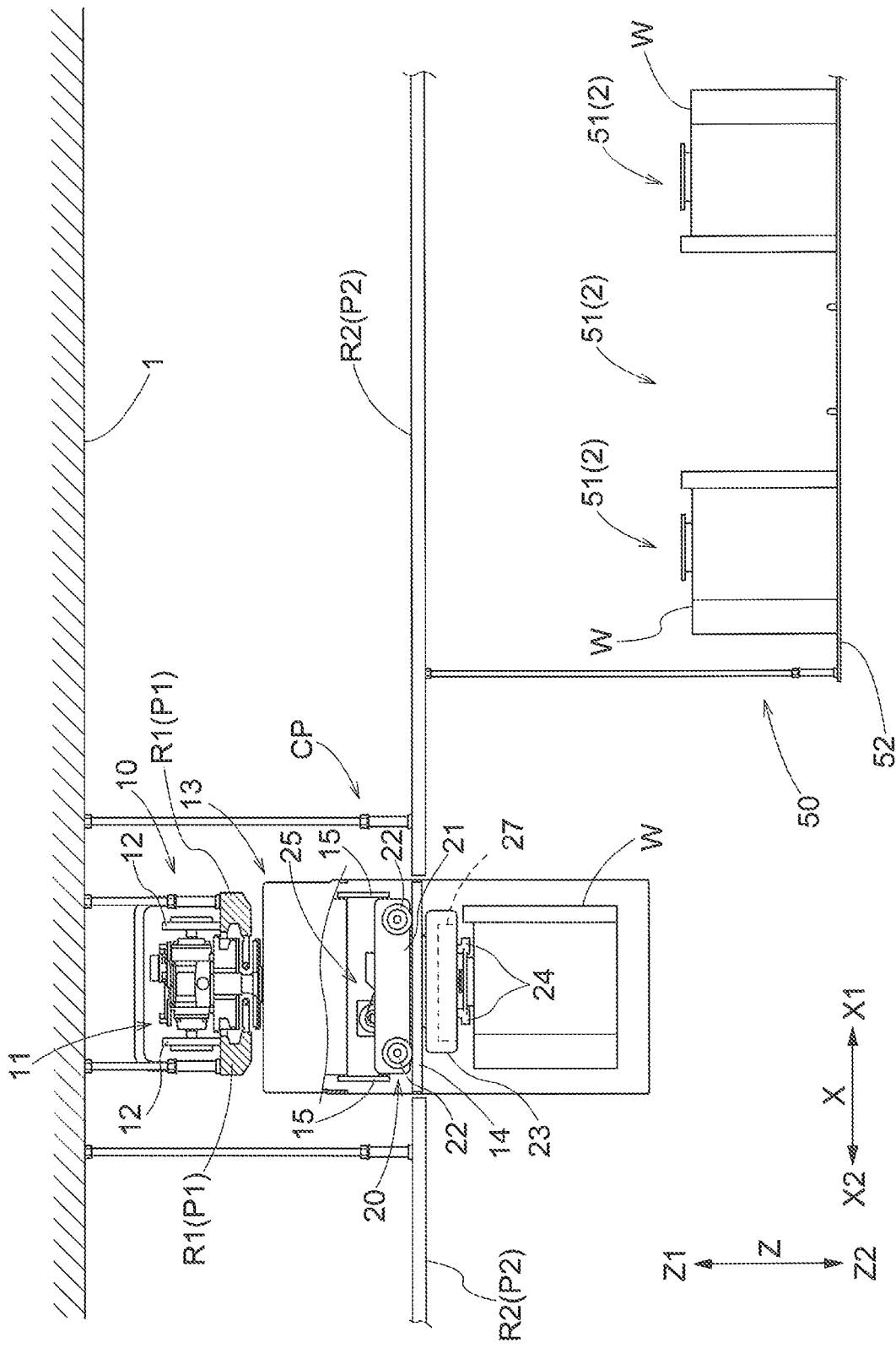
FIG. 3 is a diagram illustrating article transfer processing that is performed in a second path.

As shown in FIGS. 2 and 3, the first path P1 is formed along a ceiling 1. Specifically, the first path P1 is formed with first travel rails R1 that are suspended from the ceiling 1. That is to say, the article transport facility 100 includes first travel rails R1 that are provided along the first path P1. Although the first travel rails R1 are simplified in FIG. 1, a pair of first travel rails R1 (see FIGS. 2 and 3) that are arranged away from each other in the horizontal direction are provided along the first path P1 in the present embodiment. Note that the horizontal direction mentioned above is the width direction of the first path P1, i.e., the direction that is orthogonal to both the lengthwise direction of the first path P1 (the direction in which the first path P1 extends) and the top-bottom direction Z (the vertical direction).

As shown in FIGS. 2 and 3, the second paths P2 are formed along the ceiling 1. Specifically, the second paths P2 are formed with second travel rails R2 that are suspended from the ceiling 1. That is to say, the article transport facility 100 includes second travel rails R2 that are provided along the second paths P2. Although the second travel rails R2 are simplified in FIG. 1, a pair of second travel rails R2 (see FIG. 7(*d*)) that are arranged away from each other in the horizontal direction are provided along the second paths P2 in the present embodiment. Note that the horizontal direction mentioned above is the width direction of the second paths P2, i.e., the direction that is orthogonal to both the lengthwise direction of the second paths P2 (the direction in which the second paths P2 extend) and the top-bottom direction Z. In the present embodiment, the second travel rails R2 correspond to the "travel rail".

As shown in FIG. 1, in the present embodiment, the article transport facility 100 includes a plurality of first carriages 10 and a plurality of second carriages 20. As described below, in order to move a second carriage 20 located on a second path P2 so as to exit the second path P2, it is necessary to place a first carriage 10 on a connection part CP of the first path P1, which is connected to the second path P2. Therefore, from the viewpoint of improving efficiency in transporting articles W, it is preferable that the article transport facility 100 includes a plurality of first carriages 10. For example, it is preferable that the article transport facility 100 includes a number of first carriages 10 no less than the number of connection parts CP of the first path P1, which are connected to the second paths P2. In addition, from the viewpoint of improving efficiency in transporting articles W, it is preferable that the article transport facility 100 includes a plurality of second carriages 20. For example, it is preferable that the article transport facility 100 includes a number of second carriages 20 no less than the number of first carriages 10.

As shown in FIG. 1 as an example, in the present embodiment, a first travel direction M1 is set to be unidirectional, and a second travel direction M2 is set to be bidirectional. Here, the first travel direction M1 is the travel direction of the first carriages 10 on the first path P1, and the second travel direction M2 is the travel direction of the second carriages 20 on the second paths P2. In the example shown in FIG. 1, the first travel direction M1 of each of the second portions P1b is set so that the first travel directions M1 of two second portions P1b that are adjacent to each other in the first horizontal direction X are opposite to each other.

As shown in FIG. 1, in the present embodiment, the second travel rails R2 are provided with evacuation rails R3 for the second carriages 20 to evacuate from second paths P2 (specifically, the second paths P2 for which the second travel rails R2 are provided). Each of the evacuation rails R3 is connected to a second travel rail R2 such that the second carriages 20 can travel between the second travel rail R2 and the evacuation rail R3 (travel back and forth). By moving a second carriage 20 located on a second path P2 from a second travel rail R2 to an evacuation rails R3, it is possible to enable the second carriage 20 to evacuate from the second path P2 without using a first carriage 10. In FIG. 1, in order to avoid complication, only one second path P2 is provided with evacuation rails R3. However, a plurality of second paths P2 (for example, all of the second paths P2) may be provided with evacuation rails R3, or only second paths P2 that satisfy a specific condition (for example, only second paths P2 whose length is no less than a preset length) may be provided with evacuation rails R3.

In the example shown in FIG. 1, one end of each of the evacuation rails R3 is connected to a second travel rail R2 in a plan view, and the second carriages 20 travel in both direction along the evacuation rail R3. Also, in the example shown in FIG. 1, an evacuation rail R3 (a first evacuation rail R3$a$) for a second carriage 20 that travels on a second path P2 to one side (to the first side X1 in this example) to evacuate from the second path P2, and an evacuation rail R3 (a second evacuation rail R3$b$) for a second carriage 20 that travels on a second path P2 to the other side (to the second side X2 in this example) to evacuate from the second path P2, are separately provided. Therefore, for example, when two second carriages 20 are travelling closer to each other on the same second path P2, the second carriage 20 that is to evacuate from the second path P2 can be selected in view of efficiency in transporting the articles W in the entire facility. Therefore, it is easier to improve efficiency in transporting the articles W.

Next, the configuration of each first carriage 10 and the configuration of each second carriage 20 will be described. As shown in FIGS. 2 and 3, each second carriage 20 includes a second main body 21 that travels along second travel rails R2 (a pair of second travel rails R2 in this example), a holding unit 24 that holds an article W, and a lifting/lowering mechanism 25 that lifts and lowers the holding unit 24 relative to the second main body 21. The second main body 21 is provided with second travel wheels 22 that are rotated on second travel rails R2 (specifically, on a travel surface that is formed with the second travel rails R2). As a result of the second travel wheels 22 being driven by a drive source (not shown) such as a motor, the second main body 21 travels along the second travel rails R2. In the present embodiment, the second main body 21 corresponds to the "main body".

In the present embodiment, the holding unit 24 holds an article W from an upper side Z1 (the upper side in the top-bottom direction Z). In this example, the article W is a container that houses semiconductor wafers, and is specifically an FOUP (Front Opening Unified Pod). The holding unit 24 holds an article W by gripping a flange portion that is formed on an upper portion of the article W. The state of the holding unit 24 is switched between a holding state in which the holding unit 24 holds an article W and a holding release state in which the holding unit 24 releases the holding of the article W, as a result of a drive source (not shown) such as a motor driving.

Figure 4:
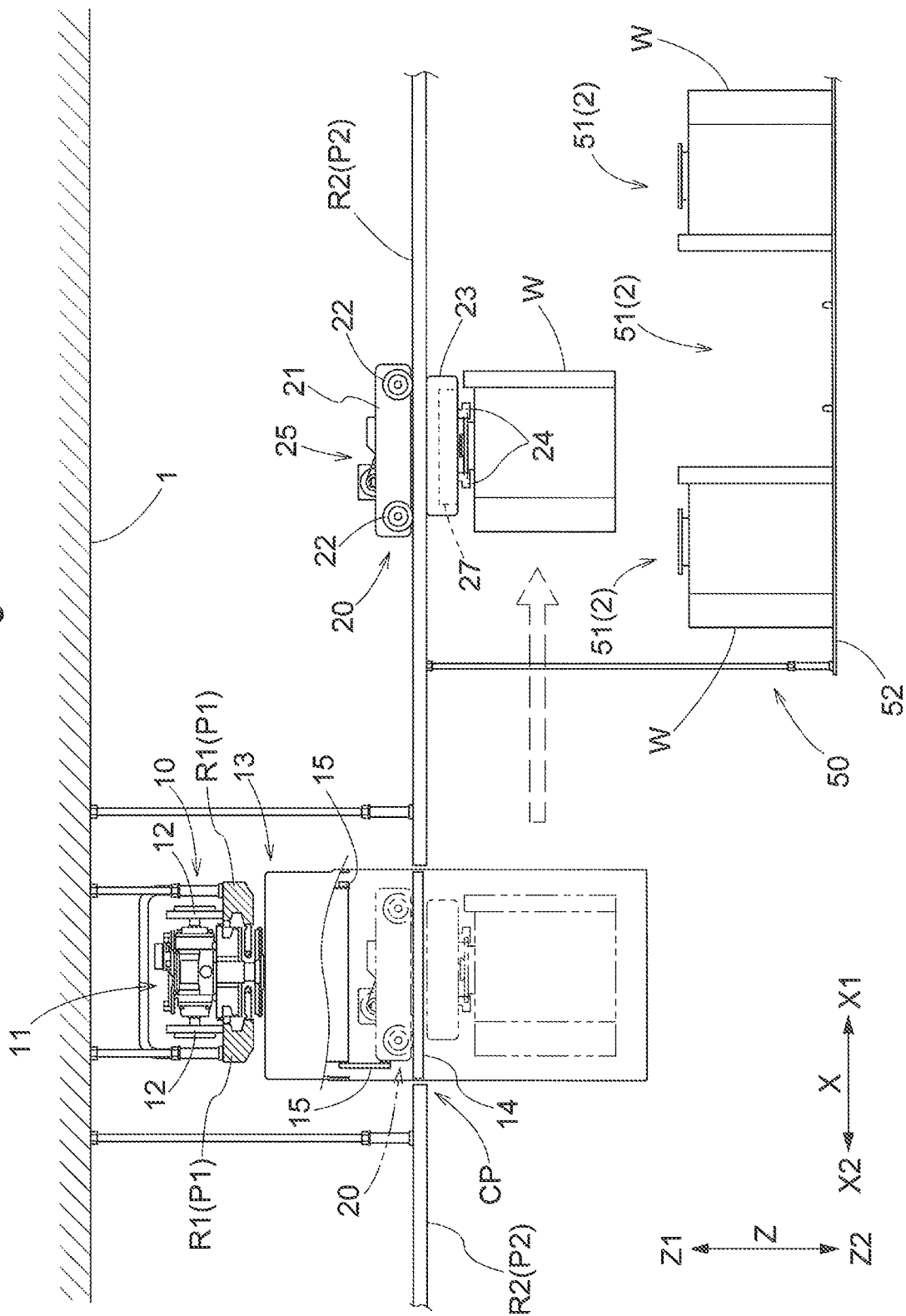
FIG. 4 is a diagram illustrating article transfer processing that is performed in the second path.
Figure 5:
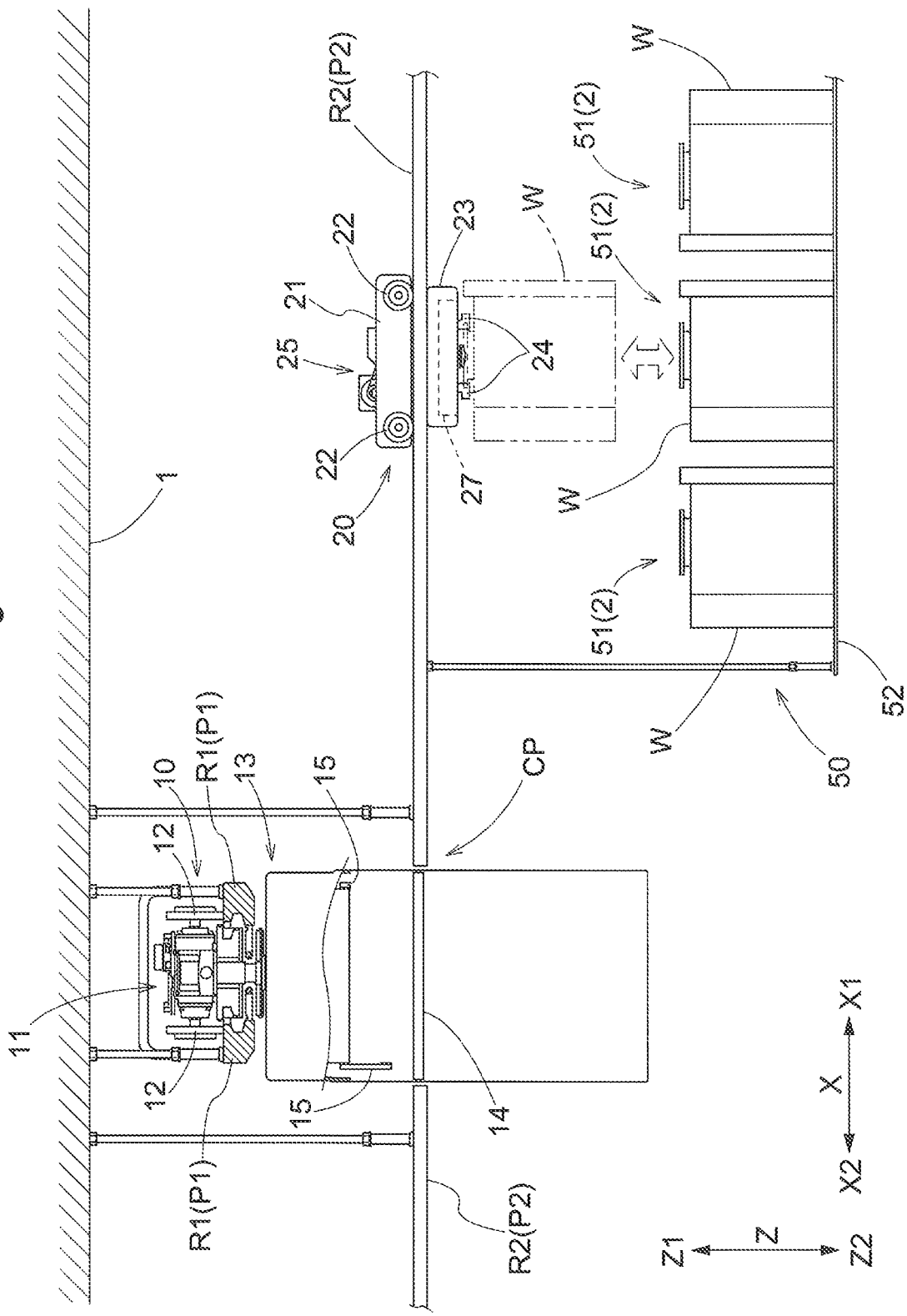
FIG. 5 is a diagram illustrating article transfer processing that is performed in the second path.

The lifting/lowering mechanism 25 lifts and lowers the holding unit 24 between a travel height that is the height of the holding unit 24 assumed when the second main body 21 is traveling and a transfer height at which an article W is transferred to a transfer target position 2. Specifically, the holding unit 24 is supported by a lifting/lowering body 23, and the lifting/lowering mechanism 25 lifts and lowers the lifting/lowering body 23 to lift and lower the holding unit 24 supported by the lifting/lowering body 23. The transfer height is set according to the height of each transfer target position 2. In FIG. 2, the holding units 24 located at the travel height are indicated by two-dot chain lines, and the holding units 24 located at the transfer height corresponding to ports 41 that serve as transfer target positions 2 are indicated by solid lines. Each port 41 is a place (a load port, or the like) at which at least one of loading and unloading of an article W is performed in a processing apparatus 40 (see FIG. 1) that processes articles W. FIGS. 3 to 5 show a holding unit 24 that is located at the travel height. Each second carriage 20 is configured to lower the holding unit 24 to the height corresponding to the transfer target position 2 (the transfer height) by using the lifting/lowering mechanism 25 when transferring an article W between the transfer target position 2 located lower than the second path P2, and the holding unit 24.

In the present embodiment, the lifting/lowering mechanism 25 lifts and lowers the lifting/lowering body 23 in the state of suspending and supporting the lifting/lowering body 23. Specifically, as shown in FIG. 2, the lifting/lowering body 23 is coupled to a leading end portion of a power transmission member 26 such as a belt or a wire. Although not shown in the drawings, the lifting/lowering mechanism 25 rotates the winding body around which the power transmission member 26 is wound, by driving a driving force source such as a motor, and winds up or unwinds the power transmission member 26 to lift or lower the lifting/lowering body 23.

In the present embodiment, each second carriage 20 includes a rotation mechanism 27 that rotates the holding unit 24 relative to the second main body 21 about an axis that extends in the top-bottom direction Z. For example, the rotation mechanism 27 is configured to rotate the holding unit 24 relative to the lifting/lowering body 23 about an axis that extends in the top-bottom direction Z, or is configured to rotate the lifting/lowering body 23 that supports the holding unit 24 relative to the second main body 21 about the axis that extends in the top-bottom direction Z. By providing the second carriage 20 with the rotation mechanism 27, it is possible to rotate the article W held by the holding unit 24 according to the orientation of the article W at the transfer target position 2.

In the present embodiment, the second carriage 20 does not have a moving mechanism for moving the holding unit 24 relative to the second main body 21 in the path width direction (the width direction of the second path P2). However, the second carriage 20 may be provided with such a moving mechanism (for example, a mechanism for moving the lifting/lowering body 23 that supports the holding unit 24 in the path width direction). As a result of providing the second carriage 20 with a moving mechanism, an article W can be transferred between the transfer target position 2 and the holding unit 24 even if the transfer target position 2 is located at a position shifted in the path width direction relative to the second path P2 in a plan view.

As shown in FIGS. 2 and 3, each first carriage 10 includes a first main body 11 that travels along the first travel rails R1 (a pair of first travel rails R1 in this example) and a carriage support portion 13 that supports a second carriage 20. The first main body 11 is provided with first travel wheels 12 that are rotated on first travel rails R1 (specifically, on a travel surface that is formed with the first travel rails R1). As a result of the first travel wheels 12 being driven by a drive source (not shown) such as a motor, the first main body 11 travels along the first travel rails R1.

The carriage support portion 13 is coupled to the first main body 11, and travels along the first path P1 together with the first main body 11. In the present embodiment, the carriage support portion 13 is suspended from the first main body 11 in the state of being located on the lower side Z2 (the lower side in the top-bottom direction Z) of the first travel rail R1. In the present embodiment, the carriage support portion 13 provides a storage space in which a second carriage 20 can be stored. This storage space is formed so as to cover a second carriage 20 from both ends in the lengthwise direction of the first path P1, and open in both ends in the width direction of the first path P1.

The first carriage 10 (specifically, the carriage support portion 13) is provided with support rails 14 that support the second main body 21. The support rails 14 are provided with a travel surface on which the second travel wheels 22 can be rotated (for example, a travel surface that has the same shape as the travel surface of the second travel rails R2). The support rails 14 support the second main body 21 from the lower side Z2 in a state where the second travel wheels 22 are placed on the travel surface of the support rails 14. The first carriage 10 is configured to travel along the first path P1 together with a second carriage 20 that is provided with the second main body 21, in a supporting state that is the state of supporting the second main body 21 using the support rails 14.

As shown in FIGS. 2 and 3, the support rails 14 are located on the extension line of the second travel rails R2 in a state where the first carriage 10 is located at the connection part CP. Therefore, the second carriage 20 can travel (back and forth) between the second travel rails R2 and the support rails 14 in a state where the first carriage 10 is located at the connection part CP. The support rails 14 are formed in a straight line and are arranged so as to extend in the width direction of the first path P1. The support rails 14 are arranged on lines extending from the second travel rails R2 toward the first carriage 10 side in the width direction of the first path P1, in a state where the first carriage 10 is located at the connection part CP. In the present embodiment, a pair of second travel rails R2 that are separated from each other in the horizontal direction are provided along the second paths P2. Therefore, the first carriage 10 is provided with a pair of support rails 14 that are separated from each other in the lengthwise direction of the first path P1. Each of the pair of support rails 14 is arranged on the extension line of the second travel rail R2 corresponding thereto, in a state where the first carriage 10 is located at the connection part CP.

The second carriage 20 travels from the second travel rails R2 to the support rails 14 in a state where the first carriage 10 is located at the connection part CP, and thus the second carriage 20 is mounted on the first carriage 10 (specifically, the second carriage 20 is stored in the carriage support portion 13). The second carriage 20 is stored on the carriage support portion 13 in a state where the second main body 21 is supported by the support rails 14. In the present embodiment, as shown in FIG. 2, the carriage support portion 13 is provided with restriction members 15 that restrict the second main body 21 from travelling along the support rails 14 in the state of being supported by the support rails 14. The restriction members 15 are provided on the two sides of the first path P1 in the width direction, and are configured to switch to a restriction orientation in which the restriction members 15 restrict the second main body 21 from travelling and a permission orientation in which the restriction members 15 allow the second main body 21 to travel. FIGS. 2 and 3 show a state in which the restriction members 15 on the two sides in the width direction of the first path P1 have been switched to the restricting orientation. In contrast, FIGS. 4 and 5 show a state in which the second carriage 20 mounted on the first carriage 10 can travel from the support rails 14 to the second travel rails R2 as a result of the restriction member 15 on one side in the width direction of the first path P1 (on the first side X1 in this example) is switched to the permission orientation.

The first carriage 10 may include a rail moving mechanism for moving the support rails 14 in the width direction of the first path P1. In this case, when the second carriage 20 travels between the second travel rails R2 and the support rails 14, the support rails 14 can be moved so as to reduce gap between the second travel rails R2 to or from which the second carriage 20 travels and the support rails 14, and enable the second carriage 20 to travel smoothly.

Figure 8:
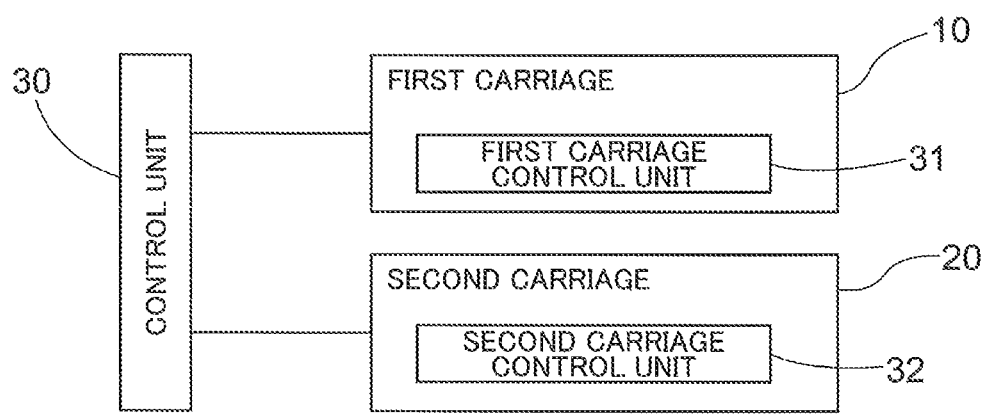
FIG. 8 is a control block diagram.

As shown in FIG. 8, the article transport facility 100 includes a control unit 30 that controls the first carriages 10 and the second carriages 20. The control unit 30 includes a computational processing unit such as a CPU and a peripheral circuit such as a memory, and these pieces of hardware and a program that is executed on hardware such as a computational processing unit cooperate with each other to realize the functions of the control unit 30.

Each first carriage 10 includes a first carriage control unit 31 (a device controller) that controls the operation of the first carriage 10 in response to a command from the control unit 30, and each second carriage 20 includes a second carriage control unit 32 (a device controller) that controls the operation of the second carriage 20 in response to a command from the control unit 30. The first carriage control unit 31 controls the operation of the first carriage 10 by controlling the drive of various motors based on information detected by various sensors, for example, and the second carriage control unit 32 controls the operation of the second carriage 20 by controlling the drive of various motors based on information detected by various sensors, for example. The control unit 30 controls the first carriage 10 via the first carriage control unit 31, and controls the second carriage 20 via the second carriage control unit 32.

The operations of the first carriage 10 to be controlled by the first carriage control unit 31 include a travel operation of the first main body 11, and further include an orientation change operation of the restriction members 15 in the present embodiment. As described above, the first travel direction M1 is set to be unidirectional in the present embodiment, and therefore the first carriage control unit 31 controls the travel operation of the first main body 11 so that the first carriage 10 travels in the preset specific direction on the first path P1. The operations of the second carriage 20 to be controlled by the second carriage control unit 32 include a travel operation of the second main body 21, a state switching operation of the holding unit 24, and a lifting/lowering operation of the holding unit 24 performed by the lifting/lowering mechanism 25, and further include a rotation operation of the holding unit 24 performed by the rotation mechanism 27 in the present embodiment. As described above, the second travel direction M2 is set to be bidirectional in the present embodiment, and therefore the second carriage control unit 32 controls the travel operation of the second main body 21 so that the second carriage 20 travels in any direction on the second paths P2.

The control unit 30 moves the second carriage 20 to a position corresponding to the transfer target position 2. Thereafter, in a state where the second carriage 20 has been stopped at the position, the control unit 30 causes the second carriage 20 to sequentially perform the operation to lower the holding unit 24 to the transfer height, the state switching operation of the holding unit 24, and the operation to lift the holding unit 24 to the travel height, thereby transferring an article W between the transfer target position 2 and the holding unit 24. Note that when transferring an article W from the holding unit 24 to the transfer target position 2, the state of the holding unit 24 is switched from the holding state to the holding release state to unload the article W held by the holding unit 24 onto the transfer target position 2. On the other hand, when transferring an article W from the transfer target position 2 to the holding unit 24, the state of the holding unit 24 is switched from the holding release state to the holding state to take the article W placed at the transfer target position 2 from the transfer target position 2.

As described above, an article W is transferred between the transfer target position 2 and the holding unit 24 in a state where the second carriage 20 is located at a position corresponding to a transfer target position 2. In the present embodiment, the position corresponding to a transfer target position 2 is a position at which the second carriage 20 overlaps the transfer target position 2 in a plan view. As shown in FIG. 1, in the present embodiment, the transfer target positions 2 are located at positions that overlap the first path P1 in a plan view. In the example shown in FIG. 1, the positions at which the ports 41 of the processing apparatus 40 and storage units 51 that store articles W overlap the first path P1 in a plan view are arranged as transfer target positions 2. When a transfer target position 2 located so as to overlap the first path P1 in a plan view in this way is the target of transfer of an article W performed by a second carriage 20 (the transfer source or transfer destination of the article W), the second carriage 20 transfers the article W between the transfer target position 2 and the holding unit 24 in a state where the second main body 21 of the second carriage 20 is supported by the support rails 14 of the first carriage 10 located so as to overlap the transfer target position 2 on the first path P1 in a plan view.

FIG. 2 shows a situation in which the ports 41 located so as to overlap the first path P1 in a plan view are used as transfer target positions 2 to which articles W are to be transferred by second carriages 20. The ports 41 shown in FIG. 2 are transfer target positions 2 located so as to overlap the connection parts CP of the first path P1 and the second paths P2 in a plan view. Therefore, in the situation shown in FIG. 2, the second carriages 20 transfer articles W between the transfer target positions 2 and the holding units 24 in a state where the second main bodies 21 of the second carriages 20 are supported by the support rails 14 of the first carriages 10 located at the connection parts CP. In the present embodiment, the ports 41 of the processing apparatus 40 or the storage units 51 storing the articles W are located so as to overlap the connection parts CP in a plan view as transfer target positions 2. In the example shown in FIG. 1, both the ports 41 and the storage units 51 are located so as to overlap the connection parts CP in a plan view as transfer target positions 2.

As shown in FIG. 1, transfer target positions 2 are also located so as to overlap the second paths P2 in a plan view. In the example shown in FIG. 1, the positions at which the ports 41 of the processing apparatus 40 and storage units 51 that store articles W overlap the second paths P2 in a plan view are arranged as transfer target positions 2. When a transfer target position 2 located so as to overlap a second path P2 in a plan view in this way is the target of transfer of an article W performed by a second carriage 20 (the transfer source or transfer destination of the article W), the second carriage 20 transfers the article W between the transfer target position 2 and the holding unit 24 in a state where the second carriage 20 is located so as to overlap the transfer target position 2 on the second path P2 in a plan view.

FIGS. 3 to 5 show a situation in which the storage units 51 located so as to overlap the second paths P2 in a plan view '(specifically the storage units 51 located adjacent to the second paths P2 on the lower side Z2) serve as transfer target position 2 at which articles W are transferred by second carriages 20. This example shows a situation in which a second carriage 20 mounted on a first carriage 10 located at a connection part CP (see FIG. 3) travels from the support rails 14 of the first carriage 10 to second travel rails R2 (see FIG. 4), and is located so as to overlap a storage unit 51 (the storage unit 51 of the transfer target of an article W) on a second path P2 in a plan view (see FIG. 5).

In the example shown in FIGS. 3 to 5, the storage units 51 are provided in a storage apparatus 50. The storage apparatus 50 includes a support unit 52 that supports an article W from the lower side Z2. The support unit 52 is configured to be able to support a plurality of articles W arranged in the lengthwise direction of the second paths P2 (in the first horizontal direction X in this example), and portions of the support unit 52 that support the articles W respectively constitute the storage units 51. In the example shown in FIGS. 3 to 5, the support unit 52 is suspended from the second travel rails R2. It is possible to employ another configuration in which the support unit 52 is suspended from the ceiling 1. Also, regarding a storage apparatus 50 located so as to overlap the first path P1 in a plan view (see FIG. 1), the support unit 52 thereof may be suspended from the first travel rail R1. The support unit 52 may be supported by a wall or the floor.

Figure 6:
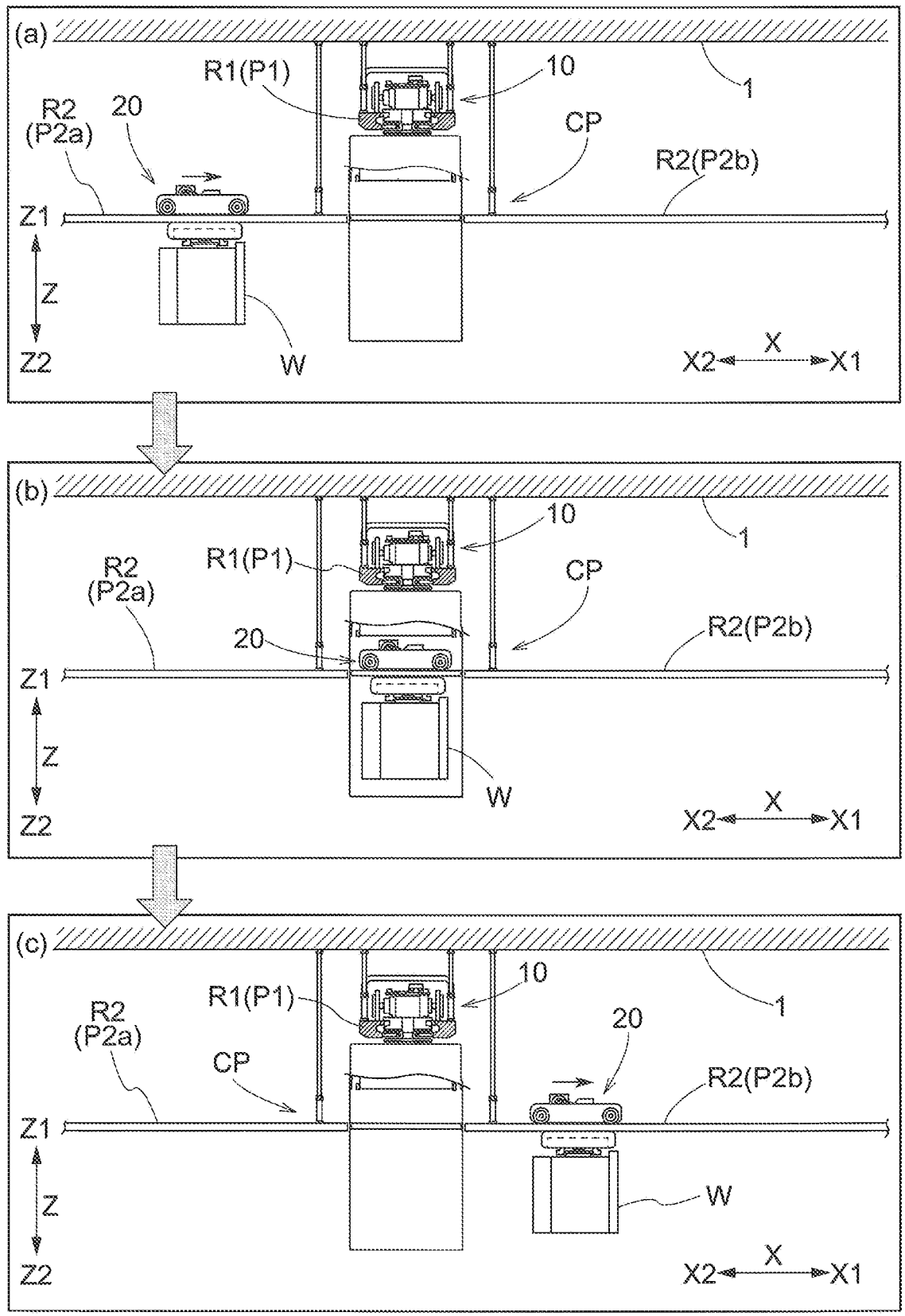
FIG. 6 is a diagram illustrating a scene in which a second carriage travels from one of two second paths that are connected to each other at the connection part to the other, in chronological order.
Figure 7:
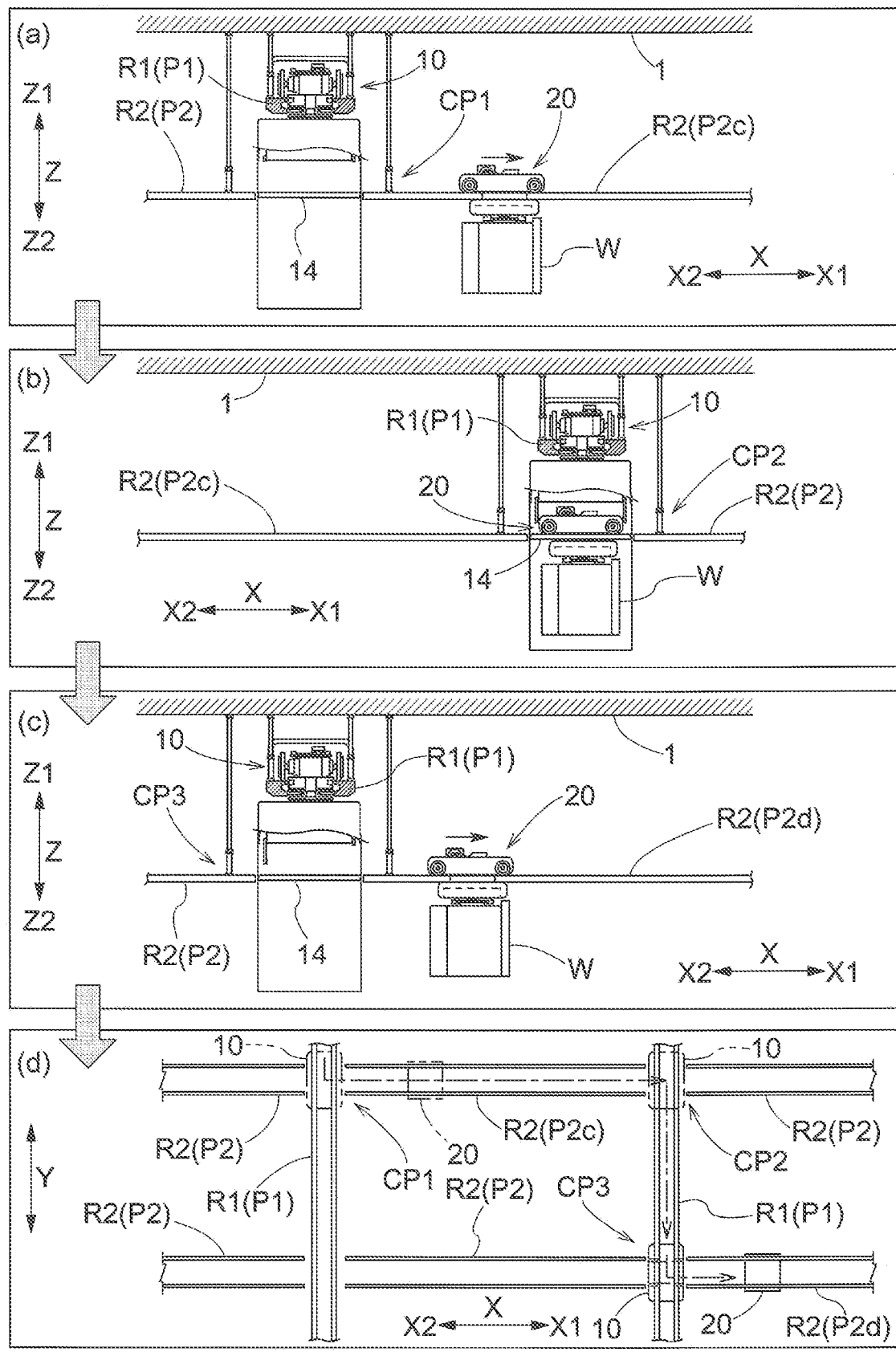
FIG. 7 is a diagram illustrating a scene in which the second carriage travels from one of two second paths that are not connected to each other at the connection part to the other, in chronological order.

When the transfer target position 2 that is the target of the transfer of an article W performed by a second carriage 20 located on a second path P2 overlaps a second path P2 different from said second path P2 in a plan view, or overlap the first path P1 in a plan view, the control unit 30 moves a second carriage 20 to a position corresponding to the transfer target position 2 using a first carriage 10. FIGS. 6 and 7 show examples of situations in which the control unit 30 performs such control.

FIG. 6 shows a scene in which a second carriage 20 is moved from a first target path P2a to a second target path P2b in chronological order, where one of two second paths P2 connected to each other at the connection part CP is the first target path P2a, and the other is the second target path P2b. In the present embodiment, the control unit 30 is configured to, when moving a target carriage that is the second carriage 20 located on the first target path P2a to the second target path P2b via the connection part CP, perform control to arrange a first carriage 10 that is not in the supporting state (i.e. a first carriage 10 that is not in the state of supporting a second main body 21 using the support rails 14 thereof) at the connection part CP according to the time at which the target carriage arrives at the connection part CP. Here, "arrange a first carriage 10 according to the time at which the target carriage arrives at the connection part CP" means that the control unit 30 arranges the first carriage 10 within a predetermined period of time that include the time at which the target carriage arrives at the connection part CP. In other words, it means that the first carriage 10 is arranged at the same time or in the same period of time as the time at which the target carriage arrives at the connection part CP. From the viewpoint of improving efficiency in transporting articles W in the entire facility, the predetermined period is preferably a short period, and the end of this predetermined period is preferably the time when the target carriage arrives at the connection part CP.

The control unit 30 performs control as described above, and therefore, in the example shown in FIG. 6, the first carriage 10 that is not in the supporting state is arranged at the connection part CP according to the time at which the second carriage 20 travelling on the first target path P2a arrives at the connection part CP (FIG. 6(a)). Here, the first carriage 10 that is not in the supporting state is arranged at the connection part CP at a point in time before the second carriage 20 arrives at the connection part CP. After travelling from the second travel rails R2 provided along the first target path P2a to the support rails 14 of the first carriage 10 arranged at the connection part CP (FIG. 6(b)), the second main body 21 of the second carriage 20 that has arrived at the connection part CP travels from the support rails 14 to the second travel rails R2 provided along the second target path P2b (FIG. 6(c)). Thus, the second carriage 20 travels from the first target path P2a to the second target path P2b via the connection part CP.

FIG. 7 shows a scene in which a second carriage 20 is moved from a third target path P2c to a fourth target path P2d in chronological order, where one of two second paths P2 not connected to each other at the connection part CP is the third target path P2c, and the other is the fourth target path P2d. As shown in FIG. 7(d), the third target path P2c and the fourth target path P2d are connected to each other via two connection parts CP (a second connection part CP2 and a third connection part CP3) and a portion of the first path P1 that connects these two connection parts CP. Note that, in FIG. 7(d), the orientation loci of the movement of the first carriage 10 and the second carriage 20 before the point in time shown in FIG. 7(d) are indicated by one-dot chain line arrows.

As shown in FIG. 7(a), the second main body 21 of the second carriage 20 travels from the support rails 14 of the first carriage 10 located at the connection part CP (the first connection part CP1) of the first path P1 connected to the third target path P2c to the second travel rails R2 provided along the third target path P2c, and thus the second carriage 20 enters the third target path P2c. The second carriage 20 travels on the third target path P2c toward the second connection part CP2, where the second connection part CP2 is the connection part CP other than the first connection part CP1 of the two connection parts CP of the first path P1 connecting to the third target path P2c.

In the present embodiment, the control unit 30 is configured to, when the target carriage, which is a second carriage 20 located on a second path P2, is to exit from the second path P2 at the connection part CP, perform control to arrange a first carriage 10 that is not in the supporting state, at the connection part CP according to the time at which the target carriage arrives at the connection part CP. Therefore, the first carriage 10 that is not in the supporting state is arranged at the second connection part CP2 according to the time when the second carriage 20 travelling on the third target path P2c arrives at the second connection part CP2, and the second main body 21 of the second carriage 20 that has arrived at the second connection part CP2 travels from the second travel rails R2 provided along the third target path P2c to the support rails 14 of the first carriage 10 arranged at the second connection part CP2 (FIG. 7(b)). As a result, the first carriage 10 arranged at the second connection part CP2 is a first carriage 10 in the supporting state. Note that the first carriage 10 arranged at the second connection part CP2 may be the same first carriage 10 as the first carriage 10 arranged at the first connection part CP1 or a different first carriage 10.

As indicated by the locus of the movement of the first carriage 10 in FIG. 7(d), the first carriage 10 that has entered the supporting state travels from the second connection part CP2 to the connection part CP (the third connection part CP3) on the first path P1 connecting to the fourth target path P2d, along the first path P1. Thereafter, in a state where the first carriage 10 in the supporting state is located at the third connection part CP3, the second main body 21 of the second carriage 20 travels from the support rails 14 of the first carriage 10 to the second travel rails R2 provided along the fourth target path P2d (FIG. 7(c)). Thus, the second carriage 20 travels from the third target path P2c to the fourth target path P2d via the two connection parts CP and the first path P1.

OTHER EMBODIMENTS

The following describes other embodiments of the article transport facility.

(1) The above embodiment describes, as an example, a configuration in which, when moving a target carriage that is the second carriage 20 located on the first target path P2a to the second target path P2b via the connection part CP, the control unit 30 performs control to arrange a first carriage 10 that is not in the supporting state at the connection part CP according to the time at which the target carriage arrives at the connection part CP. However, the present disclosure is not limited to such a configuration, and it is possible to employ a configuration in which the control unit 30 does not perform such control.

(2) The above embodiment describes, as an example, a configuration in which the ports 41 of the processing apparatuses 40 or the storage units 51 that store articles W are located so as to overlap the connection parts CP in a plan view as transfer target positions 2. However, the present disclosure is not limited to such a configuration, and it is possible to employ a configuration with which neither the ports 41 or the storage units 51 are located so as to overlap the connection parts CP in a plan view.

(3) The above embodiment describes, as an example, a configuration in which the second carriage 20 is provided with the rotation mechanism 27. However, the present disclosure is not limited to such a configuration, and it is possible to employ a configuration in which the second carriage 20 is not provided with the rotation mechanism 27.

(4) The above embodiment describes, as an example, a configuration in which the direction of travel of the second carriages 20 on the second paths P2 (the second travel direction M2) is set to be bidirectional. However, the present disclosure is not limited to such a configuration, and it is possible to employ a configuration in which the second travel direction M2 is set to be unidirectional. Also, the above embodiment describes, as an example, a configuration in which the direction of travel of the first carriages 10 on the first path P1 (the first travel direction M1) is set to be unidirectional. However, the present disclosure is not limited to such a configuration, and it is possible to employ a configuration in which the first travel direction M1 is set to be bidirectional.

(5) The above embodiment describes, as an example, a configuration in which the article transport facility 100 includes a plurality of first carriages 10 and a plurality of second carriages 20. However, the present disclosure is not limited to such a configuration, and it is possible to employ a configuration in which the article transport facility 100 includes only one first carriage 10, a configuration in which the article transport facility 100 includes only one second carriage 20, or a combination of such configurations, depending on the size and the purpose of the article transport facility 100.

(6) The above embodiment describes, as an example, a configuration in which the articles W are containers for storing semiconductor wafers. However, the present disclosure is not limited to such a configuration, and the articles W may be containers for housing objects other than semiconductor wafers (such as reticles or glass substrates) or articles other than containers.

(7) Note that the configurations disclosed in the above-described embodiments may be applied in combination with the configurations disclosed in other embodiments as long as no contradiction occurs (embodiments described as "other embodiments" may be combined with each other). With respect to other configurations, the embodiments disclosed herein are merely exemplary in all respects. Therefore, various modifications may be made as appropriate without departing from the spirit of the present disclosure.

SUMMARY OF ABOVE-DESCRIBED EMBODIMENTS

The following describes the summary of the above-described article transport facility.

An article transport facility includes: a first carriage that travels along a first path that is formed along a ceiling; a second carriage that travels along a second path whose one end or both ends are connected to the first path in a plan view; and a travel rail that is provided along the second path, wherein the second carriage includes a main body that travels along the travel rail, a holding unit that holds an article, and a lifting/lowering mechanism that lifts and lowers the holding unit relative to the main body, and is configured to, when transferring the article between a transfer target position that is located below the second path, and the holding unit, lower the holding unit by using the lifting/lowering mechanism to a height corresponding to the transfer target position, the first carriage is provided with a support rail that supports the main body, and is configured to be able to travel along the first path together with the second carriage that includes the main body, in a supporting state that is a state of supporting the main body, using the support rail, and in a state where the first carriage is located at a connection part of the first path, which is connected to the second path, the support rail is located on an extension line of the travel rail.

According to this configuration, the first carriage is configured to move along the first path together with the second carriage, in a supporting state that is the state of supporting the main body of the second carriage, using the support rail. Therefore, by causing the first carriage in the supporting state to travel along the first path, it i possible to transport an article that is held by the holding unit of the second carriage supported by the first carriage, along the first path. Also, with this configuration, by causing the second carriage to travel along the second path, it is possible to transport an article that is held by the holding unit of the second carriage, along the second path.

Also, with this configuration, in a state where the first carriage is located at a connection part of the first path, which is connected to the second path, the support rail that supports the main body of the second carriage is located on the extension line of the travel rail that is provided along the second path and along which the main body of the second carriage travels. Therefore, in this state, it is possible to cause the main body of the second carriage to travel between the support rail and the travel rail. Therefore, by arranging the first carriage at the connection part, it is possible to enable the second carriage to exit from the first carriage and enter the second path while keeping the second carriage in the state of holding an article using the holding unit, and exit from the second path so as to be mounted on the first carriage. Therefore, it is possible to swiftly transport an article between the first path and the second path at the connection part. As a result, when transporting an article along both the first path and the second path, it is possible to reduce the time required to transport the article.

Here, it is preferable that the first carriage and the second carriage are provided as a plurality of first carriages and a plurality of second carriages, respectively, a travel direction of the first carriages on the first path is set to be unidirectional, and a travel direction of the second carriages on the second path is set to be bidirectional.

With this configuration, the travel direction of the first carriages on the first path is set to be unidirectional, and therefore it is possible to improve efficiency in transporting articles by facilitating the travel of the first carriages on the first path. Also, the travel direction of the second carriages on the second path is set to be bidirectional, and therefore it is possible to improve efficiency in transporting articles by reducing the length of the transport path.

Also, it is preferable that the second carriage is provided as a plurality of second carriages, a travel direction of the second carriages on the second path is set to be bidirectional, and an evacuation rail for evacuating the second carriages from the second path is connected to the travel rail.

With this configuration, when a plurality of second carriages are arranged on one second path, it is possible to move a second carriage that is an obstruction for travel, from the travel rail to the evacuation rail so that the second carriage can evacuate from the second path. In addition, with this configuration, it is possible to enable the second carriage to evacuate from or return to the second path without using a first carriage. Therefore, it is possible to perform evacuation and return while suppressing the influence on efficiency in transporting articles in the entire facility.

It is also preferable that both ends of the second path is connected to the first path in a plan view.

With this configuration, compared to a case in which only one end of the second path is connected to the first path, it is possible to increase the degree of freedom when setting the transport path for articles via the second path. Therefore, it is possible to improve efficiency in transporting articles in the entire facility.

It is also preferable that the second carriage is provided with a rotation mechanism that rotates the holding unit relative to the main body about an axis that extends in a top-bottom direction.

With this configuration, it is possible to rotate the article held by the holding unit, according to the orientation of the article at the transfer target position. Therefore, it is easier to transfer the article between the transfer target position and the holding unit.

It is also preferable that a port at which at least one of loading and unloading of the article is performed in a processing apparatus that processes the article, or a storage unit that stores the article, is located so as to overlap the connection part as the transfer target position.

In the article transport facility according to the present disclosure, the main body of the second carriage is supported by the support rail provided on the first carriage, in a state where the second carriage is supported by the first carriage. Therefore, by appropriately providing the support rail, it is possible to keep the orientation of the second carriage so as to be appropriate for transferring an article such as a horizontal orientation, in the state where the second carriage is supported by the first carriage. As a result, by arranging the first carriage in the state of supporting the second carriage, at the connection part, it is possible to appropriately transfer an article between the transfer target position and the holding unit of the second carriage even when the transfer target position is located so as to overlap the connection part in a plan view. With this configuration, by effectively utilizing the fact that the transfer target position can be located so as to overlap the connection part in a plan view, it is possible to arrange the port or the storage unit so as to overlap the connection part in a plan view, as the transfer target position.

It is also preferable that the number of first carriages is no less than the number of connection parts.

In the article transport facility according to the present disclosure, in order to enable the second carriage to enter the second path or enable the second carriage to exit from the second path, it is necessary to arrange the first carriage at the connection part. With this configuration, the article transport facility includes a certain number of first carriages sufficient for arranging the first carriages at all the connection parts, and therefore it is possible to enable the second carriage to efficiently enter the second path or exit from the second path, and improve efficiency in transporting articles in the entire facility.

It is also preferable that the number of second carriages is no less than the number of first carriages.

When the number of first carriages and the number of second carriage are the same, if there are second carriages that are travelling along the second path, it means that there are the same number of first carriages that are in the state of not supporting second carriages, and that the article transport facility is inefficient. With this configuration, the number of second carriages included in the article transport facility is no less than the number of first carriages. Thus, it is possible to reduce the number of first carriages that are in the state of not supporting second carriages. Therefore, it is possible to improve efficiency in transporting articles in the entire facility.

It is also preferable that the article transport facility further includes a control unit that controls the first carriage and the second carriage, wherein one of two second paths connected to each other at the connection part is a first target path and the other is a second target path, and when moving a target carriage that is the second carriage located on the first target path to the second target path via the connection part, the control unit performs control to arrange the first carriage that is not in the supporting state according to the time when the target carriage arrives at the connection part.

With this configuration, by moving the main body of the target carriage that is the second carriage that is located on the first target path from the travel rail provided along the first target path to the support rail of the first carriage arranged at the connection part, and from the support rail to the travel rail provided along the second target path, it is possible to move the target carriage from the first target path to the second target path. Also, with this configuration, the first carriage that is not in the supporting state is arranged at the connection part at the same time or in the same period of time as the time at which the target carriage arrives at the connection part. Therefore, it is possible to swiftly move the target carriage from the first target path to the second target path while suppressing a decrease in the transport efficiency of the entire facility that may be caused when the first carriage is arranged at the connection part too early.

The article transport facility according to the present disclosure achieves at least one of the above-described effects.

What is claimed is:

1. An article transport facility comprising:
    a first carriage that travels along a first path that is formed along a ceiling;
    a second carriage that travels along a second path whose one end or both ends are connected to the first path in a plan view; and
    wherein:
    a travel rail that is provided along the second path,
    the second carriage comprises:
        a main body that travels along the travel rail;
        a holding unit that holds an article; and
        a lifting/lowering mechanism that lifts and lowers the holding unit relative to the main body, and is configured to, when transferring the article between a transfer target position that is located below the second path and the holding unit, lower the holding unit by using the lifting/lowering mechanism to a height corresponding to the transfer target position,
    the first carriage is provided with a support rail that supports the main body, and is configured to travel along the first path together with the second carriage that includes the main body, in a supporting state supporting the main body using the support rail,
    in a state where the first carriage is located at a connection part of the first path, which is connected to the second path, the support rail is located on an extension line of the travel rail, and the second carriage is configured to travel along the travel rail that is provided along
    the second path, independently from the first carriage, such that the first carriage is in a non-supporting state, the main body is supported by the travel rail instead of the support rail, and the second carriage is devoid of connection to the first carriage.

2. The article transport facility according to claim 1, wherein:
    the first carriage and the second carriage are provided as a plurality of first carriages and a plurality of second carriages, respectively,
    a travel direction of the first carriages on the first path is set to be unidirectional, and
    a travel direction of the second carriages on the second path is set to be bidirectional.

3. The article transport facility according to claim 1, wherein:
    the second carriage is provided as a plurality of second carriages,
    a travel direction of the second carriages on the second path is set to be bidirectional, and
    an evacuation rail for evacuating the second carriages from the second path is connected to the travel rail.

4. The article transport facility according to claim 1, wherein both ends of the second path is connected to the first path in a plan view.

5. The article transport facility according to claim 1, wherein the second carriage is provided with a rotation mechanism that rotates the holding unit relative to the main body about an axis that extends in a top-bottom direction.

6. The article transport facility according to claim 5, wherein a support unit configured to be able to support a plurality of the articles, in different postures, arranged in a lengthwise direction of the second path is located as the transfer target position at a position that overlaps the second path in a plan view.

7. The article transport facility according to claim 1, wherein a port at which at least one of loading and unloading of the article is performed in a processing apparatus that processes the article, or a storage unit that stores the article, is located so as to overlap the connection part as the transfer target position.

8. The article transport facility according to claim 1, wherein the number of first carriages is no less than the number of connection parts.

9. The article transport facility according to claim 1, wherein the number of second carriages is no less than the number of first carriages.

10. The article transport facility according to claim 1, wherein a plurality of the transfer target positions are located at both a position that overlaps the first path in a plan view and a position that overlaps the second path in a plan view.

11. An article transport facility comprising:
a first carriage that travels along a first path that is formed along a ceiling;
a second carriage that travels along a second path whose one end or both ends are connected to the first path in a plan view; and
a control unit that controls the first carriage and the second carriage,
wherein:
a travel rail is provided along the second path,
the second carriage comprises:
a main body that travels along the travel rail;
a holding unit that holds an article; and
a lifting/lowering mechanism that lifts and lowers the holding unit relative to the main body, and is configured to, when transferring the article between a transfer target position that is located below the second path and the holding unit, lower the holding unit by using the lifting/lowering mechanism to a height corresponding to the transfer target position,
the first carriage is provided with a support rail that supports the main body, and is configured to travel along the first path together with the second carriage that includes the main body, in a supporting state supporting the main body using the support rail,
in a state where the first carriage is located at a connection part of the first path, which is connected to the second path, the support rail is located on an extension line of the travel rail,
one of two second paths connected to each other at the connection part is a first target path, and the other is a second target path, and
when moving a target carriage that is the second carriage located on the first target path to the second target path via the connection part, the control unit performs control to arrange the first carriage that is not in the supporting state according to the time when the target carriage arrives at the connection part.

* * * * *